(12) United States Patent
Kwon et al.

(10) Patent No.: US 7,324,258 B2
(45) Date of Patent: Jan. 29, 2008

(54) SEMICONDUCTOR OPTICAL MODULATOR INTEGRATED RESISTOR FOR IMPEDANCE MATCHING USING SEMICONDUCTOR DOPED LAYER AND METHOD OF FABRICATING THE SAME

(75) Inventors: Yong Hwan Kwon, Daejeon (KR); Joong Seon Choe, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 162 days.

(21) Appl. No.: 11/151,217

(22) Filed: Jun. 13, 2005

(65) Prior Publication Data
US 2006/0132884 A1    Jun. 22, 2006

(30) Foreign Application Priority Data
Dec. 16, 2004  (KR)  ................ 10-2004-0107027

(51) Int. Cl.
*G02F 1/03* (2006.01)
(52) U.S. Cl. ................ 359/248; 385/2; 385/129; 359/245
(58) Field of Classification Search ................ 359/248
See application file for complete search history.

(56) References Cited

U.S. PATENT DOCUMENTS

| | | | | |
|---|---|---|---|---|
| 5,140,152 A | * | 8/1992 | Van Zeghbroeck | ..... 250/214 A |
| 6,654,399 B1 | * | 11/2003 | Kimura et al. | ............. 372/50.1 |
| 6,654,604 B2 | * | 11/2003 | Yokogawa et al. | ......... 455/424 |
| 7,205,173 B2 | * | 4/2007 | Brunson et al. | ............. 438/48 |
| 7,205,880 B2 | * | 4/2007 | Fukunaga | .................. 338/195 |
| 2002/0186727 A1 | * | 12/2002 | Aoki | ........................... 372/26 |
| 2003/0230781 A1 | * | 12/2003 | Makita et al. | ............... 257/355 |

FOREIGN PATENT DOCUMENTS

| JP | 2000 258739 | 9/2000 |
|---|---|---|
| KR | 20010105672 | 11/2001 |

OTHER PUBLICATIONS

High Speed Packaged Electroabsorption Modulators for Optical Communications, Bond et al. 2000 Electronic Components and Technology Conference, pp. 469-473.
InP-InGaAsP High-Speed Traveling-Wave Electroabsorption Modulators With Integrated Termination Resistors, Irmscher et al. IEEE Photonics Technology Letters, vol. 14, No. 7, Jul. 2002, pp. 923-925.

* cited by examiner

*Primary Examiner*—Jessica T Stultz
(74) *Attorney, Agent, or Firm*—Ladas & Parry LLP (57) ABSTRACT

Provided is a semiconductor optical modulator device in which a resistor for impedance matching is integrated in a device in order to improve performance and to reduce cost during the fabrication of an ultra high speed optical modulator module. A doped layer in an epitaxial layer of the optical modulator device is used as a resistor for impedance matching. According to this method, it is possible to more easily realize an optical device compared with optical device fabrication processes in which additional resistors are used in the outside and the inside of the device for impedance matching.

6 Claims, 6 Drawing Sheets

SEMICONDUCTOR OPTICAL MODULATOR INTEGRATED RESISTOR FOR IMPEDANCE MATCHING USING SEMICONDUCTOR DOPED LAYER AND METHOD OF FABRICATING THE SAME

CROSS-REFERENCE TO RELATED APPLICATION

This application claims priority to and the benefit of Korean Patent Application No. 2004-107027, filed Dec. 16, 2004, the disclosure of which is incorporated herein by reference in its entirety.

BACKGROUND

1. Field of the Invention

The present invention relates to a semiconductor optical modulator and a method of fabricating the same, and more particularly, a semiconductor optical modulator in which a resistor for impedance matching is integrated in a device using a semiconductor doped layer and a method of fabricating the same.

2. Discussion of Related Art

Recently noticed light sources for optical communication include a 1.55 μm wavelength distributed feedback (DFB) laser, a LiNbO$_3$ external optical modulator, an electroabsorption optical modulator, etc.

The directly modulated DFB laser that has been used for a conventional optical communication system as the light source of a high speed modulation optical communication system has restriction on the transmission distance in a long distance optical communication system having a transmission speed of no less than several Gbps due to change in a refractive index due to the implantation of carrier and increase in the line-width of modulated light caused by the change in the refractive index, that is, a chirping phenomenon. Also, due to the restriction of the modulation speed, the directly modulated DFB laser cannot be used for a long distance optical communication system having a transmission speed of 40 Gbps.

In order to solve the above-described problem, instead of the direct modulation method of the DFB laser that is a light source, a method of performing modulation using an external modulator is used. According to the light source that uses the external modulator method, the modulation line width of output light is very narrow such that it is possible to perform ultra high speed long distance transmission by a conventional dispersive optical fiber and to realize a modulation speed of 40 Gbps.

In the external modulator, the electroabsorption modulator is a device for modulating an optical signal using a phenomenon in which an absorption coefficient changes in accordance with an electric field applied to a semiconductor. Since the electroabsorption modulator is small and manufactured by a standardized semiconductor fabricating process, mass production can be performed at low price. According to the fabricated electroabsorption optical modulator device, the input reflection coefficient of radio frequency (RF) should be reduced in a desired frequency band for a high speed modulation characteristic. If possible, the input reflection coefficient should be reduced to less than −10 dB.

Figure 1:
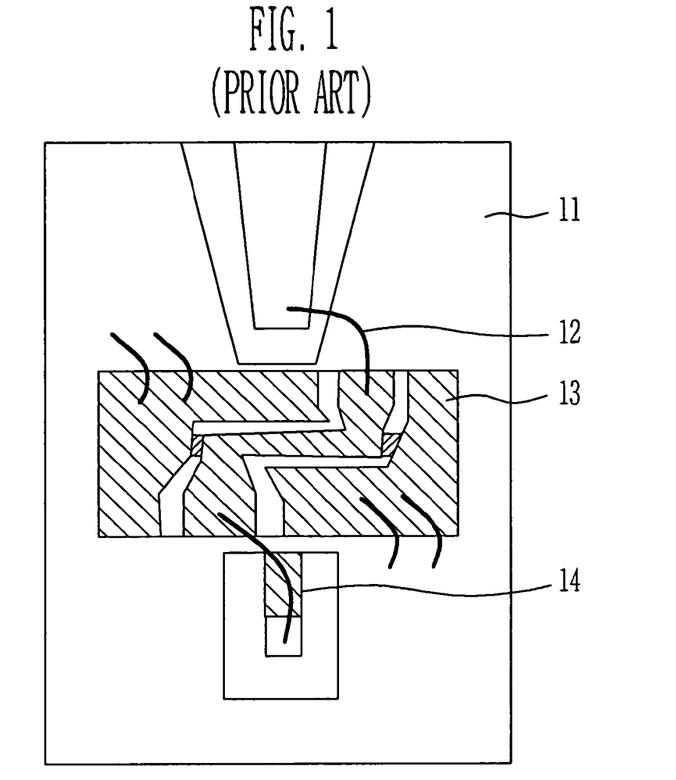
FIG. 1 is a plan view illustrating the structure of a conventional ultra high speed optical modulator using an external thin film resistor.

Therefore, as illustrated in FIG. 1, according to the conventional common semiconductor optical modulator device, an optical modulator device 13 is wire bonded 12 to a dielectric substrate 11 in which a resistor 14 for impedance matching is formed. However, according to the structure of the conventional semiconductor optical modulator device 13, the cost related to an additionally required package process occurs. To be specific, the impedance matching resistor 14 is fabricated by a thin film process in which a mask is additionally formed on the dielectric substrate on which a metal electrode is commonly formed, which leads to an increase in the cost. Also, an additional package process of connecting the fabricated dielectric substrate to the optical modulator device by die bonding and wire bonding is required. According to the structure of the conventional semiconductor optical modulator device, it is difficult to perform the wire bonding process for the ultra high speed modulation characteristic of 40 Gbps. Also, since the inductance component of Au wire of a thickness of 1 mil has a value of about 1 nH/mm and wire of a length of 100 μm also has a significant impedance value of about 25Ω in a frequency region of 40 GHz, it is difficult to perform electric connection with a low inductance component and to perform a process with reproducibility.

Figure 2:
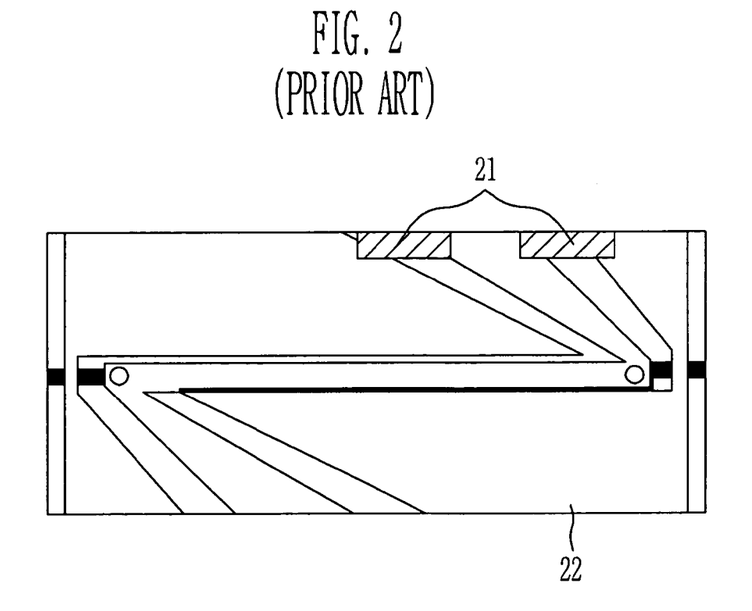
FIG. 2 is a plan view illustrating the structure of a conventional ultra high speed optical modulator using a NiCr metal resistor.

On the other hand, as illustrated in FIG. 2, there is a conventional method of forming a matching resistor 21 between optical modulator device 22 electrodes using a metal deposition process such as NiCr. However, in order to fabricate an optical modulator device using the above-described conventional method, a metal deposition process for a NiCr process and a photo transfer process using a photo mask are additionally required.

According to the above-described conventional technology, it is difficult to reduce package process related cost and to secure an ultra high frequency characteristic with reproducibility.

SUMMARY OF THE INVENTION

The present invention is directed to a method of integrating a resistor for impedance matching in an optical modulator device using a semiconductor doped layer.

The present invention is also directed to a semiconductor optical modulator in which a resistor for impedance matching is integrated using a semiconductor doped layer.

The present invention is also directed to a semiconductor optical device of a wave guide structure including a resistor for impedance matching integrated using a semiconductor doped layer.

In order to achieve the above objects, according to a first aspect of the present invention, there is provided a semiconductor optical modulator comprising: a semiconductor substrate; an n-type semiconductor doped layer, an active layer, and a p-type semiconductor doped layer deposited on the semiconductor substrate in the form of a ridge; n-type and p-type electrodes respectively formed on the n-type and p-type semiconductor doped layers; and a resistor for impedance matching formed between the n-type and p-type electrodes and formed of one of the n-type and p-type semiconductor doped layers.

The n-type and p-type electrodes may form a coplanar-shaped electrode of ground-signal-ground.

Also, the active layer region may be formed of an InGaAsP material-based multiple layer.

According to a second aspect of the present invention, there is provided an optical device fabricated using the wave guide-shaped semiconductor optical modulator structure according to the first aspect of the present invention.

According to a third aspect of the present invention, there is provided a method of fabricating a semiconductor optical modulator comprising the steps of: sequentially forming a first semiconductor doped layer, an active layer, a second semiconductor doped layer, and a first insulating layer on a semiconductor substrate; patterning the first insulating layer to form a ridge-shaped wave guide structure that reaches the first semiconductor doped layer; depositing and patterning a second insulating layer, and performing etching such that the semiconductor substrate is exposed except a region for forming a first electrode and a region for forming an impedance matching resistor; removing the insulating layer and forming a passivation layer on the wave guide structure; and sequentially forming the first and second electrodes respectively connected to the first and second semiconductor doped layers.

The step of forming the first and second electrodes may include the step of forming a coplanar-shaped electrode of ground-signal-ground of the first and second electrodes.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF PREFERRED EMBODIMENTS

Hereinafter, an exemplary embodiment of the present invention will be described in detail. However, the present invention is not limited to the embodiments disclosed below, but can be implemented in various types. Therefore, the present embodiment is provided for complete disclosure of the present invention and to fully inform the scope of the present invention to those ordinarily skilled in the art. It will also be understood that when a layer is referred to as being on another layer or substrate, it can be directly on the other layer or substrate, or intervening layers may also be present. In the drawings, the thickness of layers and regions are exaggerated for clarity. The same reference numerals in different drawings represent the same device.

Figure 3:
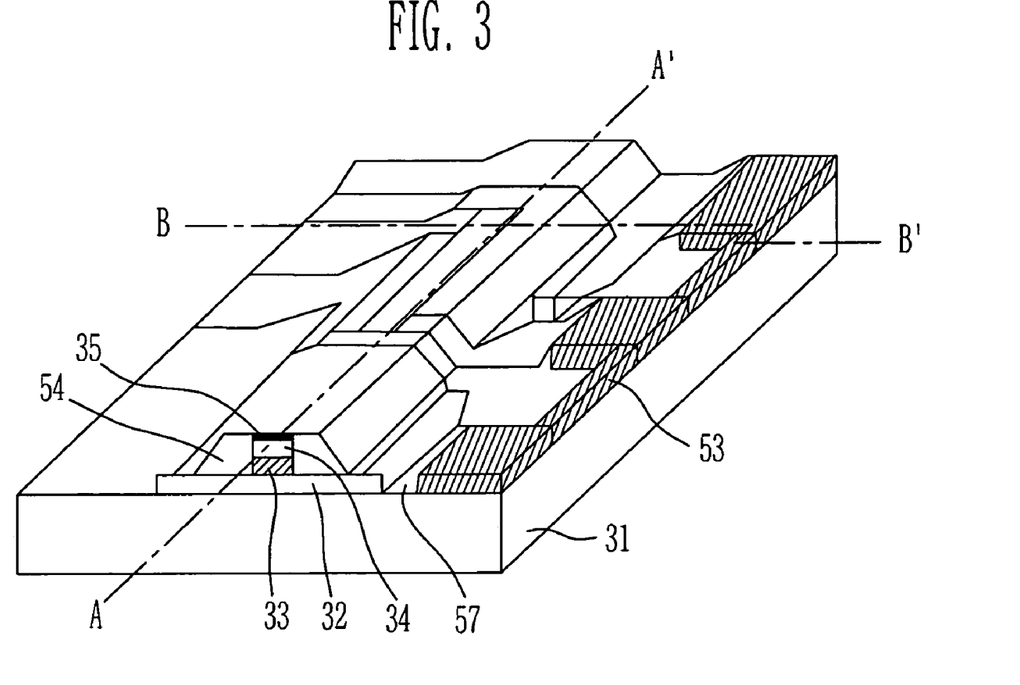
FIG. 3 is a schematic view illustrating the structure of an ultra high speed optical modulator device in which a resistor for impedance matching is integrated according to an exemplary embodiment of the present invention.

FIG. 3 is a schematic view illustrating the structure of an ultra high speed optical modulator device in which a resistor for impedance matching is integrated according to an exemplary embodiment of the present invention.

Referring to FIG. 3, the semiconductor optical modulator has a ridge-shaped wave guide structure consisting of a substrate 31, an n-type semiconductor doped layer 32, an active layer 33, and p-type semiconductor doped layers 34 and 35. Here, the n-type semiconductor doped layer 32 acts also as an n-type contact layer and an n-type clad layer. The p-type semiconductor doped layers 34 and 35 include a p-type clad layer 34 and a p-type contact layer 35.

Also, the semiconductor optical modulator includes a passivation layer 54 for protecting an absorption layer region of a wave guide structure, an n-type electrode and a p-type electrode connected to the n-type semiconductor doped layer 32 and the p-type contact layer 35, and matching impedance left in a process of etching the n-type doped layer 32 such that the matching impedance is formed by the n-type doped layer 32 between the n-type electrode and the p-type electrode. The matching impedance includes a resistor 53 connected between a ground and a signal electrode for impedance matching with an external circuit connected to the semiconductor optical modulator.

Also, according to the optical modulator, as illustrated in FIG. 3, the n-type electrode, the p-type electrode, and the n-type electrode are actually formed on the same plane of the substrate 31. That is, the semiconductor optical modulator includes a coplanar-shaped electrode 57 of ground-signal-ground. The coplanar electrode of such an n-p-n structure is appropriate to high frequency parts. According to the present embodiment, the coplanar-shaped electrode of a p-n-p structure may be formed in accordance with the epitaxial sequence of the doped layers.

As described above, according to the present invention, it is possible to skip a package or additional process by integrating the resistor for impedance matching in the device. Also, it is possible to provide a low cost and high performance semiconductor optical modulator and an optical device of a similar structure to the structure of the semiconductor optical modulator.

Figure 4A:
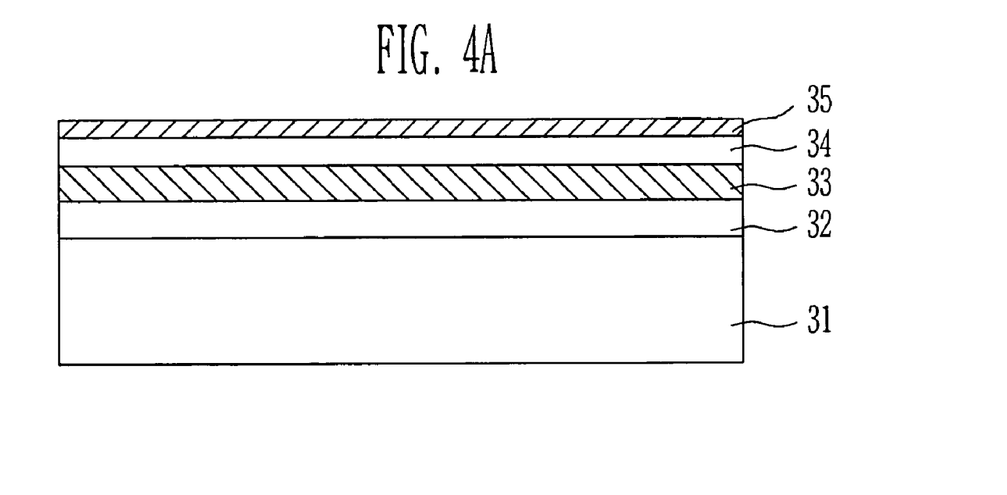
FIG. 4A is a cross-sectional view illustrating the structure of an epitaxial layer of a wave guide region taken along the line A-A' of the semiconductor optical modulator in FIG. 3.

FIG. 4A is a cross-sectional view illustrating the structure of an epitaxial layer of a wave guide region taken along the line A-A' of the semiconductor optical modulator of FIG. 3.

The present invention does not relate to the epitaxial layer structure of the semiconductor optical modulator device but the resistor is made between electrodes through a post-process. At this time, the epitaxial layer structure includes an epitaxial layer structure of the commonly used optical modulator device. Therefore, hereinafter, the epitaxial layer structure that can be used for the semiconductor optical modulator according to the present invention is described with reference to FIG. 4A.

Figure 4B:
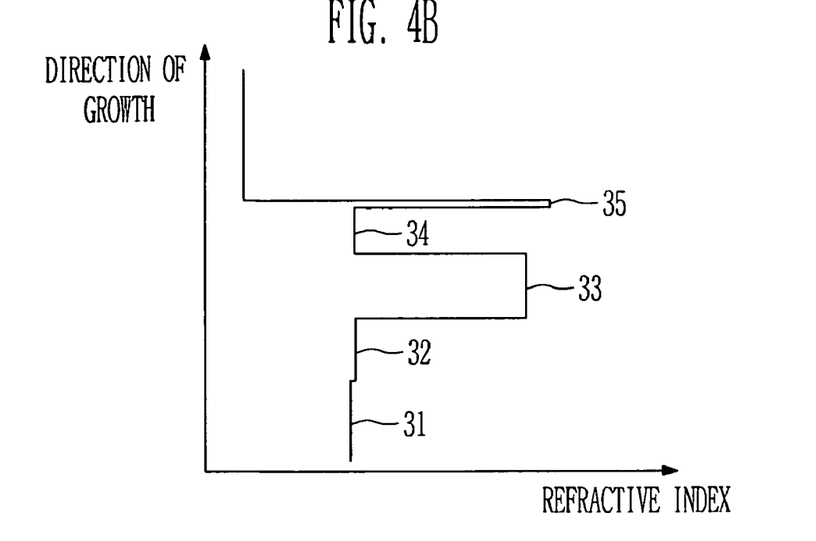
FIG. 4B is a graph illustrating refractive indices of the respective layers in the epitaxial layer of FIG. 4A.

As illustrated in FIG. 4A, the epitaxial layer of the optical modulator device is grown on a semi-insulating InP substrate 31 of the optical modulator device and is formed of a ridge-shaped multiple layer. The structure of the multiple layer is as follows. First, an n-type InP layer 32 used as an n-type contact layer and a clad layer is grown on the substrate 31. An undoped InGaAsP layer 33 is grown on the resultant structure to form an active layer region that can absorb light with a desired wavelength. At this time, the active layer region may be formed of a single layer or an InGaAs(P)/InGaAsP multiple quantum well structure. Next, a p-type InP clad layer 34 and a p+ InGaAs contact layer 35 are grown to form an epitaxial layer structure for the wave guide structure. As a reference, the refractive indices of the respective layers 31, 32, 33, 34, and 35 of the epitaxial layer according to the present embodiment are illustrated in FIG. 4B.

Next, processes of fabricating the semiconductor optical modulator according to the exemplary embodiment of the present invention will be described.

FIGS. 5A to 5F are cross-sectional views illustrating a method of fabricating a semiconductor optical modulator in which a resistor for impedance matching is integrated according to an exemplary embodiment of the present invention. The sections illustrated in FIGS. 5A to 5F correspond to sections taken along the line B-B' of the semiconductor optical modulator illustrated in FIG. 3.

Figure 5A:
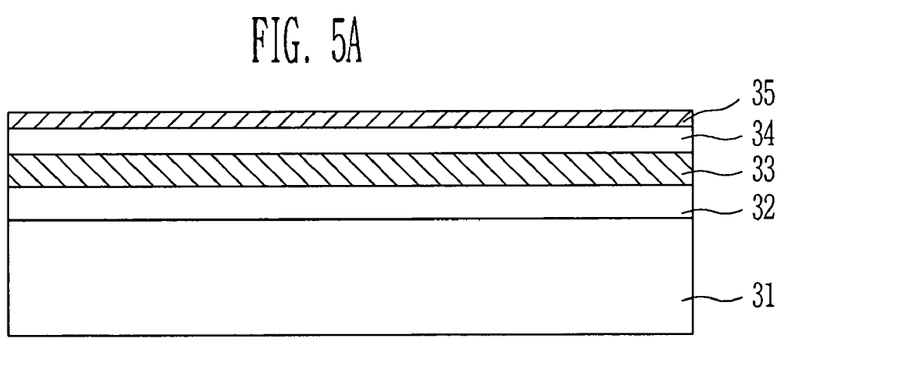
FIGS. 5A to 5F are cross-sectional views illustrating a method of fabricating a semiconductor optical modulator in which a resistor for impedance matching is integrated according to an exemplary embodiment of the present invention.

First, in order to make a ridge-shaped wave guide structure, an n-type InP layer 32 used as an n-type contact layer and a clad layer is grown on a substrate 31 as illustrated in FIG. 5A and an undoped InGaAsP layer 33 is grown on the resultant structure. Then, a p-type InP clad layer 34 and a p+ InGaAs contact layer 35 are grown on the resultant structure.

Figure 5B:
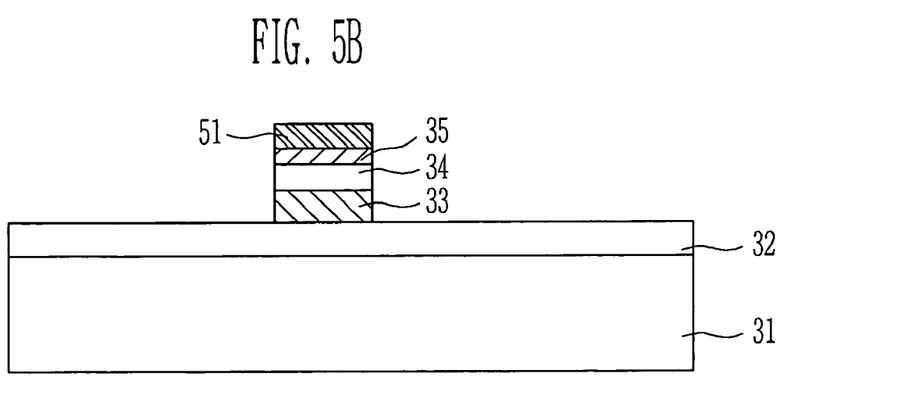

Next, a first insulating layer 51 made of a material such as SiNx is deposited and a wave guide pattern for defining the active layer is formed. Then, dry and wet etching is performed using the pattern. Then, as illustrated in FIG. 5B, a ridge-shaped wave guide structure having a width of 1 to 4 μm and a depth of the n-type contact layer 32 is formed. At this time, in the wave guide structure, etching may be performed to the portion immediately on the n-type contact layer 32 or to a predetermined thickness of the n-type contact layer 32.

Figure 5C:
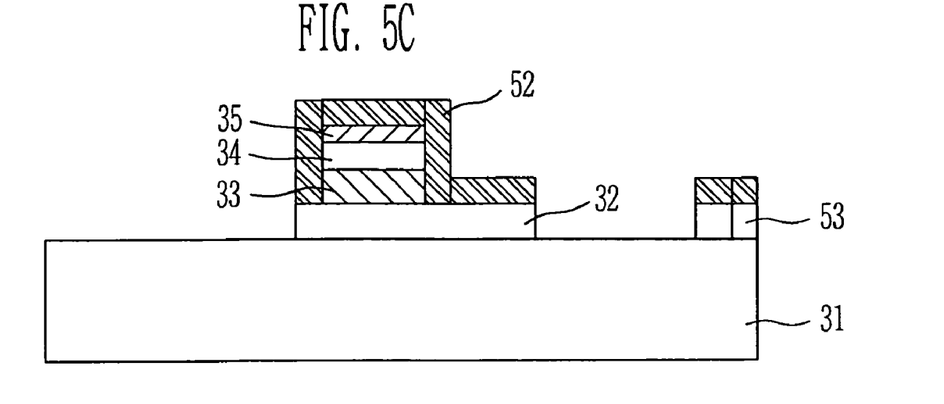

Then, after removing the first insulating layer 51, as illustrated in FIG. 5C, a second insulating layer 52 made of a material such as SiNx is deposited and the remaining portion excluding a portion for forming n-type ohmic and a portion for forming an impedance matching resistor is etched until the semi-insulating substrate 31 is revealed. This process is essential to reduce a dielectric loss caused by the doped layer under the electrodes in the case of the semiconductor optical modulator for high frequency of no less than 10 Gbps.

That is, the present process is a core process of the present invention. As illustrated in FIG. 5C, according to the present process, a part of the n-type contact layer is left in the end of the coplanar-shaped electrode (refer to 57 of FIG. 5F) of ground-signal-ground to form the resistor 53 for impedance matching. According to the present invention, the process of forming the impedance matching resistor 53 is simultaneously performed together with the etching process of revealing the semi-insulating substrate 31 for forming the n-type ohmic. Therefore, an additional process is not required.

Figure 5D:
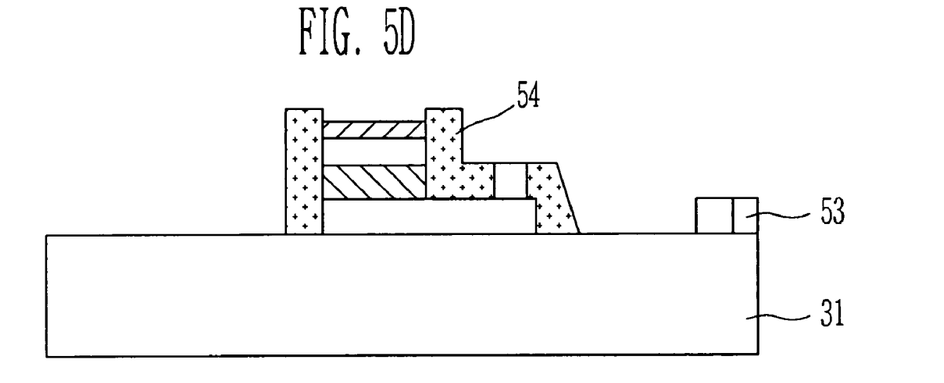

Next, after removing the second insulating layer 52, as illustrated in FIG. 5D, a passivation layer 54 such as polyimide is formed on the absorption layer region of the above structure revealed in the air to protect the absorption layer region.

Figure 5E:
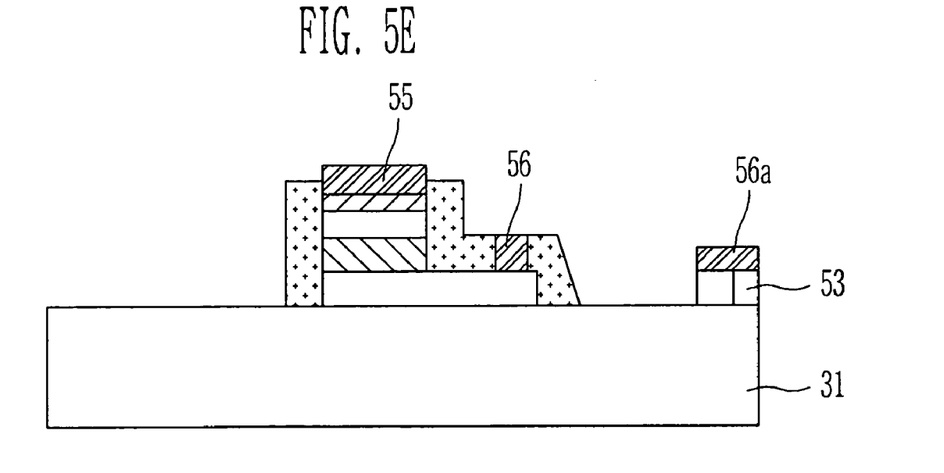

Next, as illustrated in FIG. 5E, a p-type electrode 55 and n-type electrodes 56 and 56a are sequentially deposited. Here, the n-type electrodes 56 and 56a and the p-type electrode 55 may be represented as a first electrode and a second electrode of the semiconductor optical modulator.

Figure 5F:
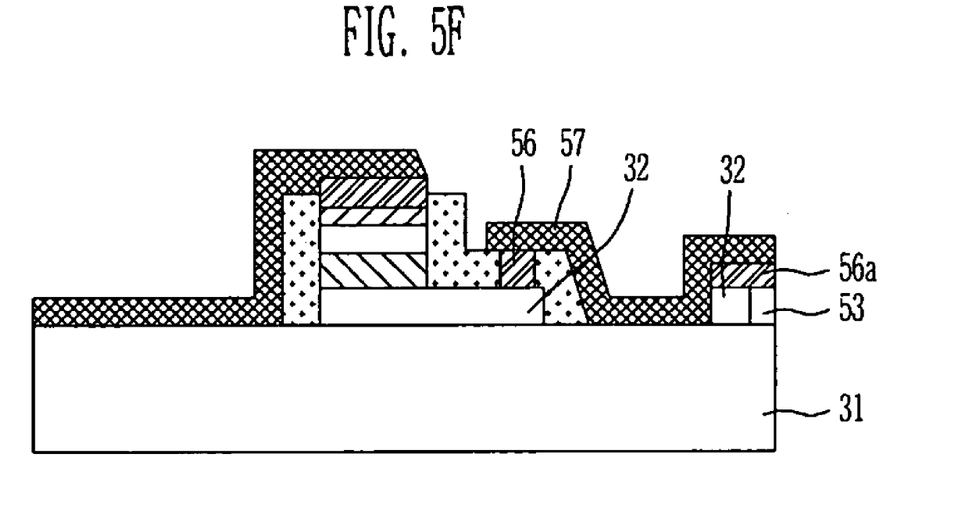

Then, as illustrated in FIG. 5F, an additional n-type electrode 57 for connecting the two n-type electrodes 56 and 56a is finally deposited and an additional p-type electrode for connecting a p-type electrode 55 of a similar structure to the structure of the n-type electrode 57 formed on the actually same plane to another p-type electrode (not shown) formed on the substrate 31 is finally deposited such that a coplanar-shaped electrode of ground-signal-ground is formed on the semiconductor substrate 31 (refer to FIG. 3).

As described above, according to the fabrication method of the present embodiment, an additional package process is not required for fabrication of the semiconductor optical modulator in which the impedance matching resistor is integrated, unlike the conventional method of fabricating the optical modulator device. Furthermore, when the fabrication method of the present embodiment is compared with the conventional method of fabricating the semiconductor optical modulator illustrated in FIG. 2, the metal deposition process of NiCr and the photo transfer process using a photo mask are not required.

Figure 6:
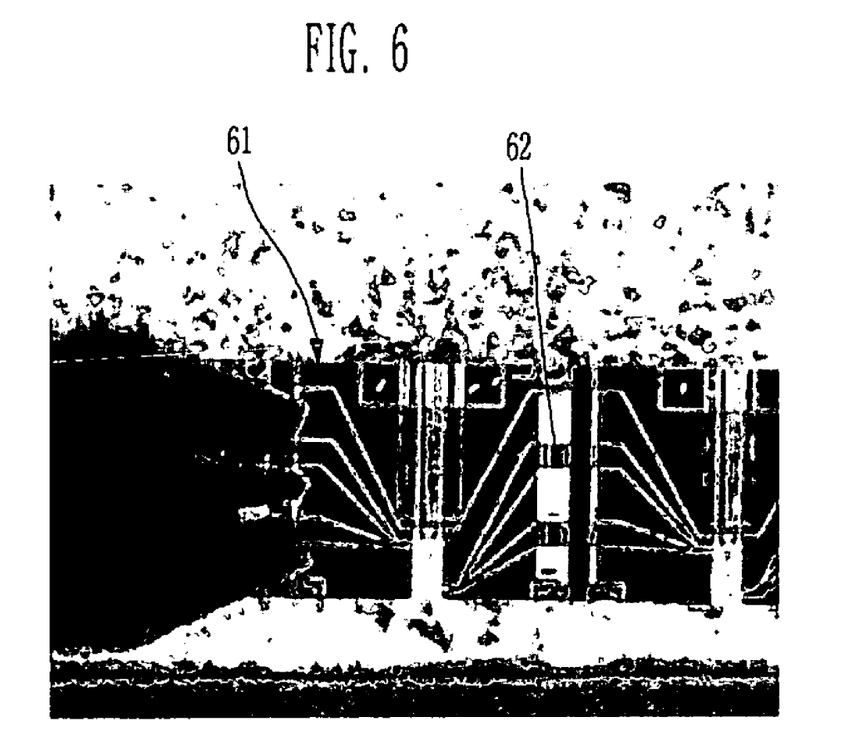
FIG. 6 is a photography of an ultra high speed optical modulator device in which a resistor for impedance matching is integrated according to an exemplary embodiment of the present invention.
Figure 7:
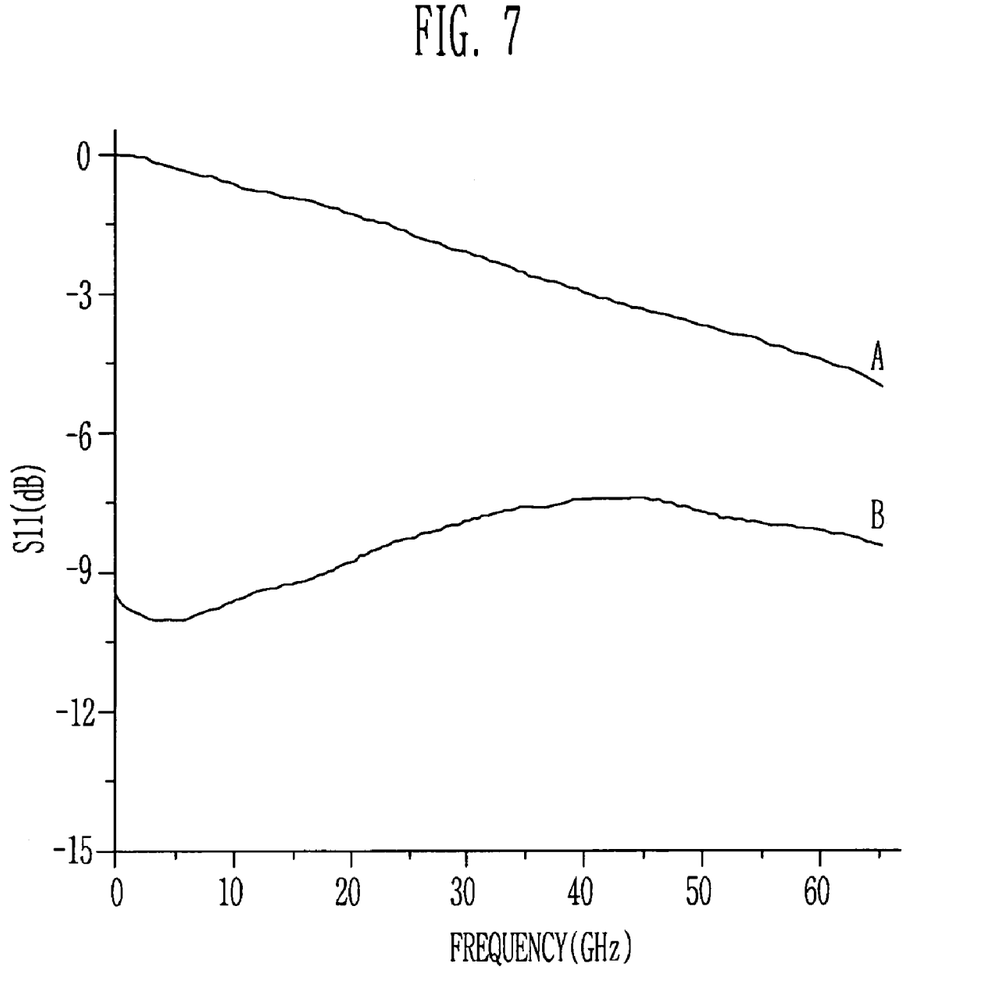
FIG. 7 is a graph illustrating the reflection coefficient characteristics of ultra high speed optical modulators when there exists a resistor for impedance matching and when there exists no resistor for impedance matching.

FIG. 6 is a photograph illustrating an ultra high speed optical modulator device in which a resistor for impedance matching is integrated according to an exemplary embodiment of the present invention. FIG. 7 is a graph illustrating the reflection coefficient characteristics of ultra high speed optical modulators when there exists a resistor for impedance matching and when there exists no resistor for impedance matching.

The core process of the method of fabricating the semiconductor optical modulator according to the present invention is to realize a desired resistor between ground and signal electrodes by remaining a part of the n-type contact layer during the etching process of revealing the semi-insulating substrate. A semiconductor optical modulator 61 illustrated in FIG. 6 is realized by an experiment. At this time, the doping concentration of the n-type contact layer for an impedance matching resistor 62 is $1\times1.0^{18}$ cm$^{-3}$, the thickness of the n-type contact layer is 500 nm, the length of the resistor 62 connected between the ground and signal electrodes is 50 μm, and the width of the resistor 62 is 10 μm.

As a result of the experiment, a resistor of about 200Ω was secured as the impedance matching resistor integrated in the semiconductor optical modulator. As illustrated in FIG. 7, when the case in which the resistor exists is compared with the case A in which no resistor exists, it was noted that it is possible to secure a significantly low reflection coefficient in almost all frequency bands when there exists the resistor. This is only an example. It is noted by the present invention that it is possible to form an impedance matching region having better characteristics by controlling variables such as the doping concentration and the thickness of the n-type contact layer for the impedance matching resistor 62 and the length and the width of the connected portion. For example, when the impedance matching resistor can be appropriately formed to have a length of 10 to 100 μm, a width of 10 to 100 μm, and a thickness of 0.1 to 100 μm, and a resistance value of 10 to 100Ω.

As a modification, it is possible to grow the region doped with n-type impurities and the region doped with p-type impurities in an inverse order in the epitaxial structure according to the present invention. In such a case, the region doped with the p-type impurities may be used as the resistor for impedance matching. Since the basic structure of the present invention is used for this method, the method belongs to the scope of the present invention.

As another modification, the semiconductor optical modulator in which the resistor for impedance matching is integrated according to the present invention is coupled with a functional device having another wave guide structure. Various optical devices such as a laser diode and a semiconductor optical amplifier may be used as the functional device having the wave guide structure. The device coupled with the modulator fabricated using the structure and the fabrication method according to the present invention can be considered as a modification of the present invention.

According to the above-described present invention, it is possible to more easily realize the impedance matching of the semiconductor optical modulator compared with the conventional art. Therefore, according to the optical device structure of the present invention, it is possible to reduce cost for the package or additional process and to improve the performance of the semiconductor optical modulator. Also, it is possible to reduce cost for fabricating the external resistor for impedance matching and to simplify the package process such as additional wire bonding.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A semiconductor optical modulator comprising:
   a semiconductor substrate;
   a wave guide structure comprising a first layer of an n-type semiconductor doped layer, an active layer, and a second layer of a p-type semiconductor doped layer deposited on the semiconductor substrate;
   n-type and p-type electrodes respectively formed on the first and second layers; and
   a resistor for impedance matching formed coplanar with the first layer between the n-type and p-type electrodes.

2. The semiconductor optical modulator according to claim 1, wherein the n-type and p-type electrodes form a coplanar-shaped electrode of ground-signal-ground.

3. The semiconductor optical modulator according to claim 1, wherein the active layer region is formed of an InGaAsP material-based multiple layer.

4. The semiconductor optical modulator according to claim 1, wherein the resistor for impedance matching has a length of 10 to 100 μm, a width of 10 to 100 μm, and a thickness of 0.1 to 10 μm.

5. The semiconductor optical modulator according to claim 1, wherein the resistor for impedance matching has a resistance value of 10 to 100Ω.

6. An optical device fabricated using the wave guide-shaped semiconductor optical modulator structure according to any one of claims 1 to 5.

* * * * *